(12) United States Patent
Ohtani

(10) Patent No.: US 6,501,132 B1
(45) Date of Patent: Dec. 31, 2002

(54) TRANSISTOR WITH VARIABLE CHANNEL WIDTH

(75) Inventor: Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/468,859

(22) Filed: Dec. 21, 1999

Related U.S. Application Data

(62) Division of application No. 09/110,894, filed on Jul. 7, 1998, now Pat. No. 6,013,929.

(30) Foreign Application Priority Data

Jul. 8, 1997 (JP) ............................................. 9-199285
May 18, 1998 (JP) ........................................... 10-135018

(51) Int. Cl.⁷ .................................................. H01L 29/01
(52) U.S. Cl. ........................................ 257/347; 257/349
(58) Field of Search ................................ 257/347, 349, 257/59–72, 324, 382, 389

(56) References Cited

U.S. PATENT DOCUMENTS

| | | | |
|---|---|---|---|
| 5,314,834 A | 5/1994 | Mazure et al. | |
| 5,616,935 A | 4/1997 | Koyama et al. | |
| 5,668,032 A | 9/1997 | Holmberg et al. | |
| 5,705,829 A | 1/1998 | Miyanaga et al. | |
| 5,888,857 A | * 3/1999 | Zhang et al. | |
| 5,914,494 A | 6/1999 | Sazawa et al. | |
| 5,963,278 A | * 10/1999 | Yamazaki et al. | |
| 6,013,929 A | * 1/2000 | Ohtani | 257/349 |

FOREIGN PATENT DOCUMENTS

| | | |
|---|---|---|
| JP | 3-38755 | 6/1991 |
| JP | 404176165 | * 6/1992 |
| JP | 4-360580 | 12/1992 |
| JP | 5-166837 | 7/1993 |

* cited by examiner

*Primary Examiner*—Fetsum Abraham
(74) *Attorney, Agent, or Firm*—Eric J. Robinson; Robinson Intellectual Property Law Office, P.C.

(57) ABSTRACT

A gate insulating film 103 is oxidized by a thermal oxidation method using a gate electrode 104 as a mask. At this time, the thickness of the gate insulating film 103 becomes thicker so that the portions indicated by 106 and 107 are obtained. The thickness of an active layer becomes thin at an end 112 of a channel, so that the distance from the gate electrode becomes long by the thickness. Then the strength of an electric field between a source and drain is relaxed by this portion. In this way, a thin film transistor having improved withstand voltage characteristics and leak current characteristics is obtained.

26 Claims, 3 Drawing Sheets

TRANSISTOR WITH VARIABLE CHANNEL WIDTH

This application is a Divisional of application Ser. No. 09/110,894 filed Jul. 7, 1998. U.S. Pat. No. 6,013,929.

BACKGROUND OF THE INVENTION

1. Field of the Invention

The present invention relates to a structure of a thin film transistor in which its withstand voltage characteristics and leak current characteristics are improved. The present invention also relates to a method of manufacturing the thin film transistor.

2. Description of the Related Art

In recent years, there has been known a technique in which a thin film semiconductor film is formed on a glass substrate or a quartz substrate and a transistor is manufactured by using the film as an active layer. This transistor is generically referred to as a thin film transistor. The thin film transistor will be hereinafter referred to as a TFT.

In general, as a semiconductor thin film for forming an active layer of a TFT, an amorphous silicon film or a crystalline silicon film (polycrystalline film or microcrystalline film) is used. This is because a single crystal silicon film can not be formed on a glass substrate or a quartz substrate by an existing technique.

Although low withstand voltage and large OFF-state current value do not become a subject of discussion in a TFT using an amorphous silicon film since its total characteristics are also low, they become a problem in a TFT using a crystalline silicon film.

This problem is caused because the density of defects existing in the silicon film is extremely high as compared with single crystal silicon.

As means for solving the problem, there are known structures disclosed in Japanese Patent Publication No. Hei. 3-38755 and Japanese Patent Unexamined Publication Nos. Hei. 4-360580 and Hei. 5-166837.

The structures disclosed in the above publications are referred to as an LDD technique or an offset technique. In these techniques, a high resistance region, which does not function as a channel or a drain, is disposed between a channel region and a drain region, so that a high electric filed applied between the channel region and the drain region is relaxed.

At an OFF operation, the movement of carriers via defects present in the vicinity of the boundary between the channel region and the drain region is suppressed.

The type of high resistance region is roughly divided into a structure of a non-doped region (generically referred to as an offset structure) and a structure of a lightly doped region (generically referred to as an LDD structure).

Japanese Patent Unexamined Publication Nos. Hei. 4-360580 and Hei. 5-166837 disclose a technique as a method of forming a high resistance region in which an anodic oxidation film is formed on the surface of a gate electrode and the high resistance region is formed in a self-aligning manner by the thickness of the anodic oxidation film.

This method has a feature that the high resistance region can be formed with high controllability.

SUMMARY OF THE INVENTION

An object of the present invention is to provide a TFT with a novel structure in which its withstand voltage is high and OFF-state current is small.

According to a first aspect of the present invention, a thin film transistor comprises an active layer composed of some regions, a gate insulating film of a silicon oxide film formed on the active layer, and a gate electrode formed on the gate insulting film, and is characterized in that the active layer has been subjected to oxidation using the gate electrode as a mask, and the shape of a certain portion of the gate insulating film is different from that of the other portion thereof.

The certain portion is formed by thermal oxidation using the gate electrode as a mask. In this portion, the thermal oxidation in the active layer progresses to a region under the gate electrode.

In this state, the end of the upper portion of a channel region formed in the active layer is selectively oxidized. By making such a structure, it is possible to realize the state in which the thickness of the gate insulating film at the end of the upper portion of the channel gradually becomes thicker in the direction from the channel to a source or from the channel to a drain.

According to another aspect of the present invention, a method of manufacturing a thin film transistor comprises the steps of: forming a silicon oxide film on an active layer; forming a gate electrode on the silicon oxide film; and carrying out thermal oxidation using the gate electrode as a mask to increase the thickness of the silicon oxide film except a portion; and is characterized in that the end of the region subjected to the thermal oxidation extends to the portion under the gate electrode.

In this structure, the end of the upper portion of the channel region is selectively oxidized. That is, the thermal oxidation progresses to the end of the upper portion of the channel region.

By adopting this structure, the thickness of the gate insulating film at the end of the upper portion of the channel region is gradually changed. That is, it is possible to obtain such a structure that the thickness of the gate insulating film gradually becomes thicker in the direction from the end of the upper portion of the channel region to the source/drain regions.

The silicon oxide film prior to the thermal oxidation may be a silicon oxide film having an incomplete constitution. This film may contain an element other than oxygen and silicon if the film has such a film quality that thermal oxidation progresses.

In the manufacturing steps of the present invention, after the gate insulating film of the silicon oxide film is formed, the gate electrode is formed, and then the thermal oxidation is carried out.

By this, the thermal oxidation progresses in the portion except the region where the gate electrode is disposed, and the thickness of the portion becomes thick. The thermal oxidation also progresses to a portion under the gate electrode.

In this way, a state in which the thickness of the gate insulating film is gradually changed, is obtained in this portion. That is, there is obtained such a state that the thickness of the gate insulating film becomes thicker in the direction from the end of the upper portion of the channel region to the source/drain regions.

By this, it is possible to realize the structure in which the electric field applied to the active layer from the gate electrode is gradually weakened correspondingly to the change of the thickness of the gate insulating film in the direction from the end of the upper portion of the channel region to the source/drain regions.

The inversion layer formed on the end of the upper portion of the channel region can be made weak as compared with that on the center of the channel, and there is obtained an effect similar to the case where a lightly doped region or an offset region is formed.

That is, it is possible to realize the structure in which the electric field applied between the channel region and the drain region can be made weak.

DETAILED DESCRIPTION OF THE PREFERRED EMBODIMENTS

[Embodiment 1]

FIGS. 1A to 1D show manufacturing steps in this embodiment. First, a not-shown amorphous silicon film with a thickness of 50 nm is formed on a quartz substrate 101 by a low pressure CVD method. It is suitable to select the thickness of the silicon film within the range of 20 nm to 100 nm. Next, the amorphous silicon film is crystallized by a heat treatment to obtain a crystalline silicon film.

Figure 1A:
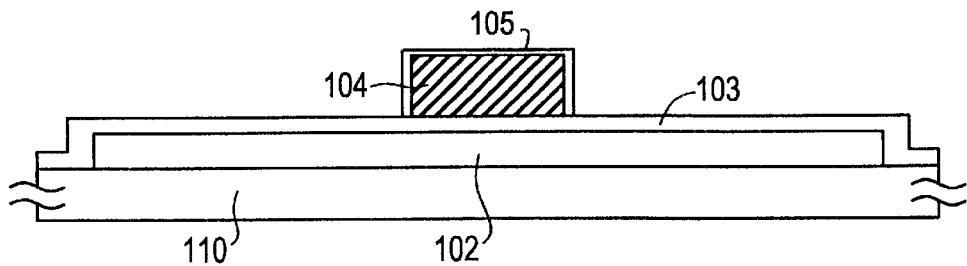
FIGS. 1A to 1D are views showing manufacturing steps of a TFT of Embodiment 1.

The thus obtained crystalline silicon film is patterned to obtain an active layer pattern 102 shown in FIG. 1A.

Next, a silicon oxide film 103 with a thickness of 30 nm as the origin of a gate insulating film is formed by a plasma CVD method. Here, the film growth is carried out by using $SiH_4$, $N_2O$ and $O_2$ as raw material gas.

Next, a tantalum film with a thickness of 400 nm is formed by a sputtering method. The tantalum film is patterned to form a pattern 104. Further, an anodic oxidation film 105 is formed on the circumferential surface of the tantalum pattern 104 (FIG. 1A).

Here, the thickness of the anodic oxidation film is made 80 nm. In this way, the gate electrode 104 having the anodic oxidation film 105 formed on the circumferential surface thereof is obtained (FIG. 1A).

Next, in an oxygen atmosphere, a heat treatment at 950°C. for 30 minutes is carried out. In this step, thermal oxidation progresses mainly in an exposed portion of the silicon oxide film 103 so that a gate insulating film 100 including thick oxide films 106 and 107 is obtained.

The thermal oxidation progresses so as to intrude into the periphery of a portion under the gate electrode 104 as indicated by 108. That is, the thermal oxidation also progresses into the portion of the active layer at the side end lower portion of the gate electrode (FIG. 1B).

The feature in this state is that the thickness of the gate insulating film is gradually increased in the direction from the side end lower portion 108 of the gate electrode to the upper portion of a source region and the upper portion of a drain region.

Figure 1B:
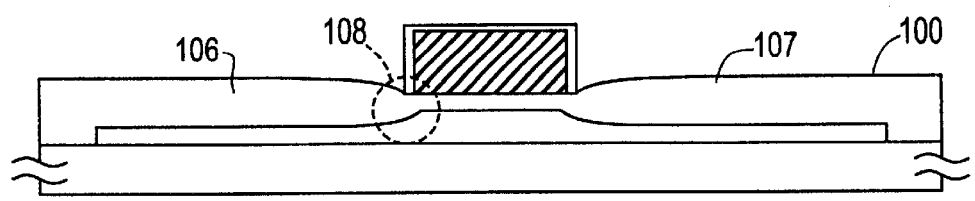
Figure 1C:
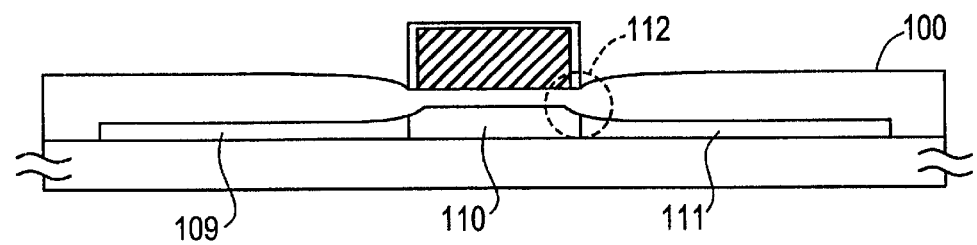

After the state shown in FIG. 1B is obtained, doping of phosphorus is carried out by using the gate electrode 104 as a mask. Here, the doping of phosphorus is carried out by a plasma doping method. In this embodiment, since an N-channel TFT is fabricated, the doping of phosphorus is carried out. If a P-channel TFT is fabricated, doping of boron is carried out (FIG. 1C).

In this step, a source region 109, a channel region 110, and a drain region 111 are formed in a self-aligning manner.

Although the drawing shows as if the position of the interface between the source region 109 and the channel region 110, and the interface between the drain region 111 and the channel region 110 substantially coincides with the position of the surface of the anodic oxidation film 105 formed on the side of the gate electrode 104, the position of the interface becomes slightly different by the intrusion of ions or conditions of a subsequent activation step.

After the doping of phosphorus is ended, laser beam irradiation is carried out to anneal damages of a crystal structure generated at the doping and to activate dopants.

In the structure shown in this embodiment, in a portion 112, that is, in the interface between the source region 109 and the channel region 110 and its vicinities, and in the interface between the drain region 111 and the channel region 110 and its vicinities, such a structure is obtained that the thickness of a gate insulating film 100 gradually becomes thicker toward the source/drain regions.

By making such a structure, the electric field from the gate electrode is gradually weakened toward the source/drain regions in the interfaces between the channel region and the source/drain regions and the vicinities thereof.

In this structure, in an OFF state for example, the resistance of a portion of the channel region adjacent to the source/drain regions (portion at the end of the channel) becomes high as compared with the center of the channel. This portion functions as a high resistance region like an offset region or an LDD region.

That is, by making the resistance of the portion of the channel region adjacent to the source/drain regions high as compared with the center of the channel, it is possible to relax a high electric field applied between the channel region and the drain region at an OFF operation.

In this way, it is possible to realize the structure in which an OFF-state current is lowered.

The above-mentioned function also operates at an ON operation, and in this case, there is obtained an effect to increase the withstand voltage.

Figure 1D:
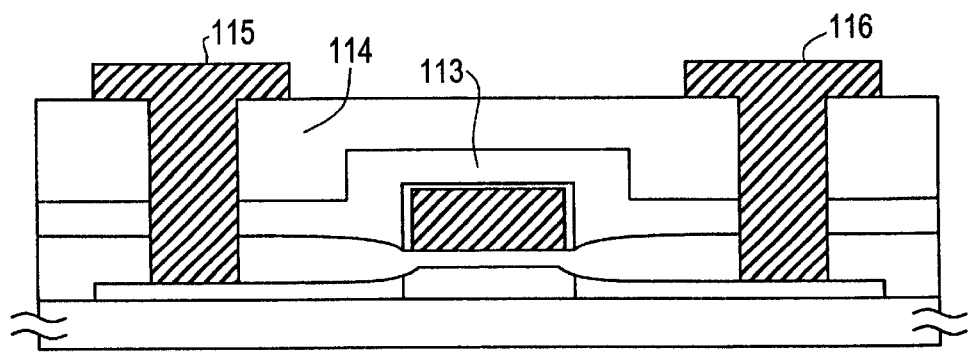

After the state shown in FIG. 1C is obtained, as shown in FIG. 1D, a silicon nitride film 113 with a thickness of 150 nm is formed as an interlayer insulating film by a plasma CVD method, and further, an acrylic resin film 114 is formed.

The thickness of the acrylic resin film is adjusted so that the minimum thickness becomes 700 nm. Here, the acrylic resin film is used to secure the flatness of the surface. Polyimide, polyamide, polyimide amide, epoxy, etc. may be used other than acryl.

Next, contact holes are formed, and a source electrode 115 and a drain electrode 116 are formed. In this way, the N-channel TFF is completed.

[Embodiment 2]

In this embodiment, in the structure shown in embodiment 1, the thickness of the anodic oxidation film 105 is made as thick as 200 nm. In this case, it becomes impossible to neglect the role that the film thickness functions as a mask at doping. By the film thickness, offset gate regions are formed between the channel region and the source/drain regions.

That is, the offset regions are formed adjacently to the channel region, and the source/drain regions are formed adjacently to the offset regions.

In the structure shown in this embodiment, just in the portion where the offset region is formed, the thickness of the gate insulating film gradually becomes thick from the end of the upper portion of the channel region to the source/drain regions.

In this structure, in addition to the effect obtained from the existence of the offset region, the effect of the structure shown in embodiment 1 can be obtained. The withstand voltage and OFF current characteristics can be further improved.

[Embodiment 3]

In this embodiment, in the manufacturing steps shown in embodiment 1, after the silicon oxide film 103 is formed on the active layer 102 and the gate electrode 104 is formed, a step in which the silicon oxide film 103 is patterned by dry etching is introduced.

FIGS. 2A to 2E show the manufacturing steps in this embodiment. First, similarly to embodiment 1, a not-shown amorphous silicon film with a thickness of 50 nm is formed on a quartz substrate 201 by a low pressure CVD method. It is suitable to select the thickness of the silicon film within the range of 20 nm to 100 nm. Next, the amorphous silicon film is crystallized by a heat treatment to obtain a crystalline silicon film.

Figure 2A:
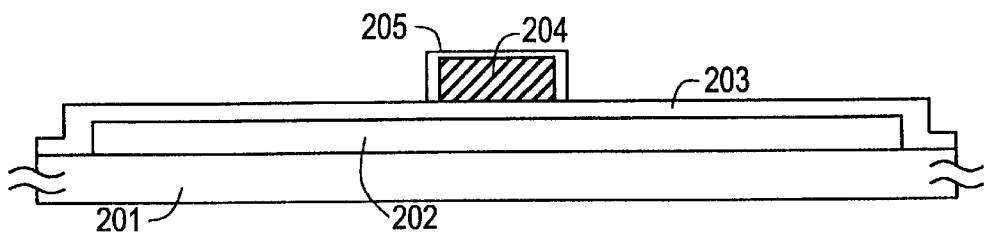
FIGS. 2A to 2E are views showing manufacturing steps of a TFT of Embodiment 3.

The thus obtained crystalline silicon film is patterned to obtain an active layer pattern 202 shown in FIG. 2A.

Next, a silicon oxide film 203 with a thickness of 30 nm as the origin of a gate insulating film is formed by a plasma CVD method. Here, $SiH_4$, $N_2O$ and $O_2$ are used as raw material gas.

Next, a tantalum film with a thickness of 400 nm is formed by a sputtering method. The tantalum film is patterned to form a pattern 204. Further, an anodic oxidation film 205 is formed on the circumferential surface of the tantalum pattern 204 by an anodic oxidation method.

Here, similarly to embodiment 1, the thickness of the anodic oxidation film 205 is made 80 nm. In this way, the gate electrode 204 having the anodic oxidation film 205 formed on the circumferential surface thereof is obtained (FIG. 2A).

Figure 2B:
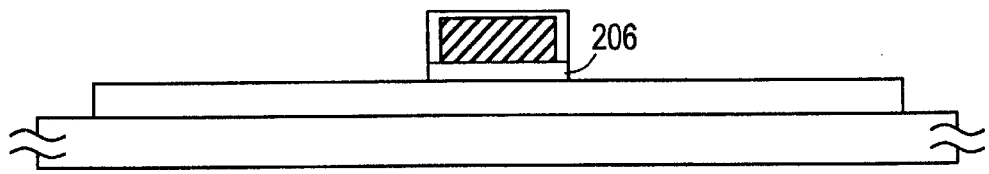

Next, by using the gate electrode 204 as a mask, the silicon oxide film 203 is dry etched by $CHF_3$ and is patterned, so that a silicon oxide film 206 is obtained (FIG. 2B).

Next, in an oxygen atmosphere, a heat treatment at 950° C. for 30 minutes is carried out. In this step, thermal oxidation newly progresses in the exposed portion of the active layer pattern 202 of the crystalline silicon film so that a gate insulating film 200 including such regions indicated by 207 and 208 is obtained.

The thermal oxidation progresses so as to intrude into the periphery of a portion under the side end of the gate electrode 204, as indicated by 209. That is, the thermal oxidation also progresses into the portion of the active layer positioned at the side end lower portion of the silicon oxide film 206, so that the silicon oxide film 206 and the gate insulating film 200 are integrated with each other and the state shown in FIG. 2C is obtained.

The feature in this state is that the thickness of the gate insulating film gradually becomes thicker from the side end lower portion 209 of the gate electrode to the upper portion of a source region and the upper portion of a drain region.

Figure 2C:
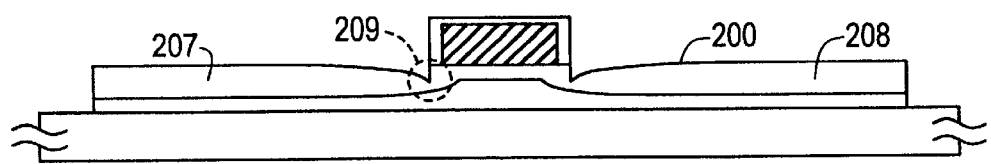
Figure 2D:
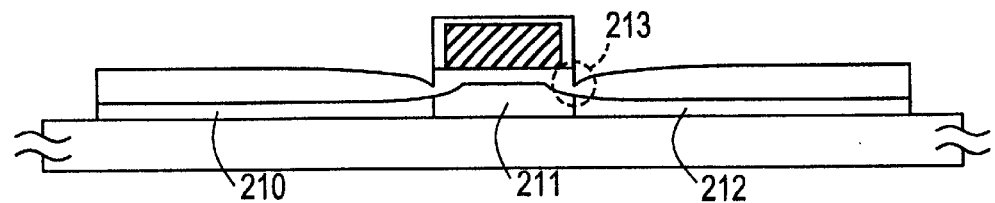
Figure 2E:
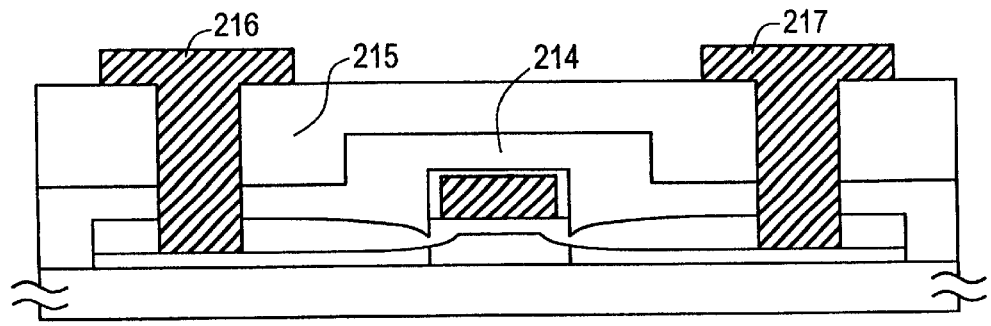

After the state shown in FIG. 2C is obtained, doping of phosphorus is carried out by using the gate electrode 204 as a mask. Here, similarly to embodiment 1, the doping of phosphorus is carried out by a plasma doping method. In this embodiment, since an N-type TFT is fabricated, the doping of phosphorus is carried out. If a P-channel TFT is fabricated, doping of boron is carried out (FIG. 2D).

In this step, a source region 210, a channel region 211, and a drain region 212 are formed in a self-aligning manner.

In the drawing, it is shown as if the position of the interface between the source region 210 and the channel region 211, and the interface between the drain region 212 and the channel region 211 substantially coincides with the position of the surface of the anodic oxidation film 205 formed on the side of the gate electrode 204. However, the position of the interface becomes slightly different by the intrusion of ions or conditions of a subsequent activation step.

After the doping of phosphorus is ended, laser beam irradiation is carried out so that damages of a crystal structure generated at the doping are annealed and the dopants are activated.

In the structure shown in this embodiment, the thickness of the gate insulating film 200 gradually becomes thicker in portions 213, that is, in the interface between the source region 210 and the channel region 211 and its vicinities, and in the interface between the drain region 212 and the channel region 211 and its vicinities.

By such a structure, it is possible to gradually weaken an electric field, which is applied from the gate electrode, toward the direction of source/drain in the interfaces between the channel region and the source/drain regions and the vicinities thereof.

According to this structure, in an OFF state for example, the resistance of a portion of the channel region adjacent to the source/drain regions (portion at the end of the channel region) becomes high as compared with the center of the channel. This portion functions as a high resistance region like an offset region or an LDD region.

That is, the resistance of the portion of the channel region adjacent to the source/drain regions is made high as compared with the center of the channel, so that it is possible to relax a high electric field applied between the channel region and the drain region at an OFF operation.

In this way, it is possible to make the structure in which an OFF-state current is lowered.

The above-mentioned function also operates at an ON operation, and in this case, the effect of increasing the withstand voltage can be obtained.

After the state shown in FIG. 2D is obtained, a silicon nitride film 214 with a thickness of 150 nm is formed as an interlayer insulating film by a plasma CVD method. Further, an acrylic resin film 215 is formed.

The thickness of the acrylic resin film is adjusted so that the minimum thickness becomes 700 nm. Here, the acrylic resin film is used to secure the flatness of the surface. Polyimide, polyamide, polyimide amide, epoxy, etc. may be used other than acryl.

Next, contact holes are formed, and a source electrode 216 and a drain electrode 217 are formed. In this way, the N-channel TFT is completed.

In this embodiment, since the gate insulating film 200 is thinner than the case of embodiment 1, it is possible to make the depth of the formed contact hole shorter than embodiment 1.

[Embodiment 4]

In this embodiment, in the structure shown in embodiment 1 or 3, a silicon material given a conductivity type is used as a material of a gate electrode.

Various kinds of silicide materials or metallic materials may be used other than silicon materials. For example, tungsten silicide, molybdenum silicide, and the like may be used. However, since a step of forming a thermal oxidation film is required after the formation of the gate electrode, it is necessary to use a material for the gate electrode, which can withstand heating at thermal oxidation.

[Embodiment 5]

The thin film transistor disclosed in the present specification can be used for various kinds of thin film integrated circuits, various kinds of flat panel displays, an information processing terminal equipped with a flat panel display, a video camera, and the like. In the present specification, these devices will be generically referred to as a semiconductor device.

Examples of the specific structures of various semiconductor devices will be described below. FIGS. 3A to 3F show examples of the various kinds of semiconductor devices. Each of these semiconductor devices uses the TFT for at least a part thereof.

Figure 3A:
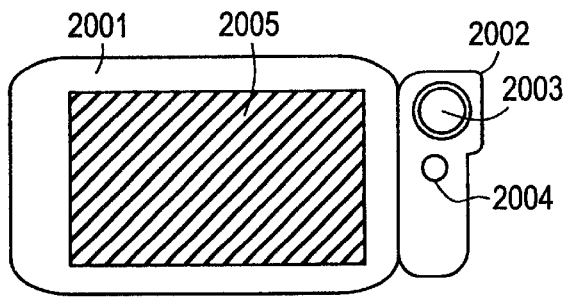
FIGS. 3A to 3F are schematic views showing examples of devices using TFTs of Embodiment 5.

FIG. 3A shows a portable information processing terminal. This information processing terminal includes a main body 2001 equipped with an active matrix type liquid crystal display or an active matrix type EL display 2005 and a camera portion 2002 for taking in information from the outside.

An image receiving portion 2003 and an operation switch 2004 are disposed at the camera portion 2002.

It is supposed that in future, the information processing terminal becomes increasingly thin and light to improve the portability.

In such a structure, it is preferable to integrate a peripheral driving circuit, an arithmetic circuit, and a memory circuit by TFTs on a substrate where the active matrix type display 2005 is formed.

Figure 3B:
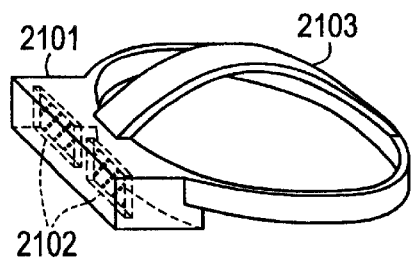

FIG. 3B shows a head mount display. This device includes a main body 2101 equipped with an active matrix type liquid crystal display or an EL display 2102. The main body 2101 can be mounted on a head by a band 2103.

Figure 3C:
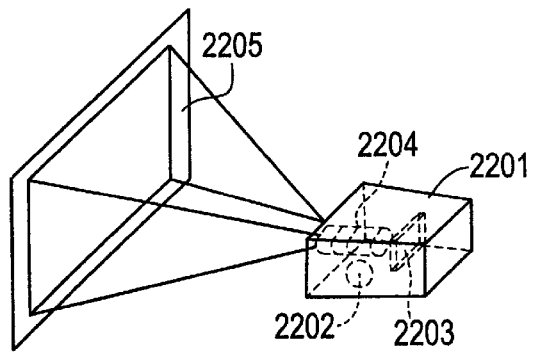

FIG. 3C shows a projection type liquid crystal display device which is a device referred to as a front projection type.

This device has such a function that light from a light source 2202 installed in a main body 2201 is optically modulated by a refection type liquid crystal display device 2203, and is enlarged by an optical system 2204 so that an image is projected onto a screen 2205.

In such a structure, the optical system 2204 is required to be miniaturized to the utmost in view of cost. Correspondingly to the requirement, the display device 2203 is also required to be miniaturized.

In the case where an active matrix type flat panel display is miniaturized, it is required that a peripheral driving circuit for driving the active matrix circuit is also integrated on the same substrate as the active matrix circuit.

This is because when the active matrix circuit is miniaturized, even if a circuit for constituting the peripheral driving circuit is formed by an externally mounted IC, it becomes difficult to install the IC.

Thus, in the display device 2203, such a structure is adopted that the active matrix circuit and peripheral driving circuit are integrated on the same substrate by TFTs.

In this example, a reflection type is used for the liquid crystal display device 2203. However, a transmission type liquid crystal display device may be used. In this case, an optical system becomes different.

Figure 3D:
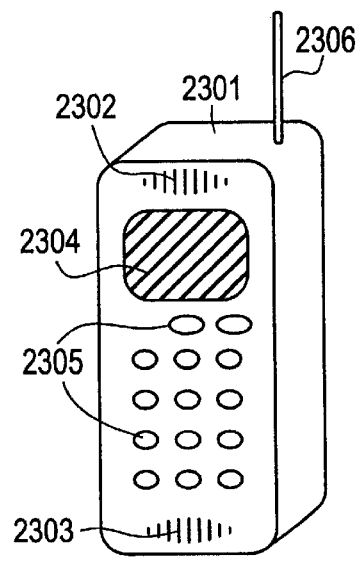

FIG. 3D shows a portable telephone. This device includes a main body 2301 equipped with an active matrix type liquid crystal display device 2304, an operation switch 2305, an audio input portion 2303, an audio output portion 2302, and an antenna 2306.

In recent years, a structure such as a combination of the portable information processing terminal as shown in FIG. 3A and the portable telephone as shown in FIG. 3D has been produced on a commercial basis.

Figure 3E:
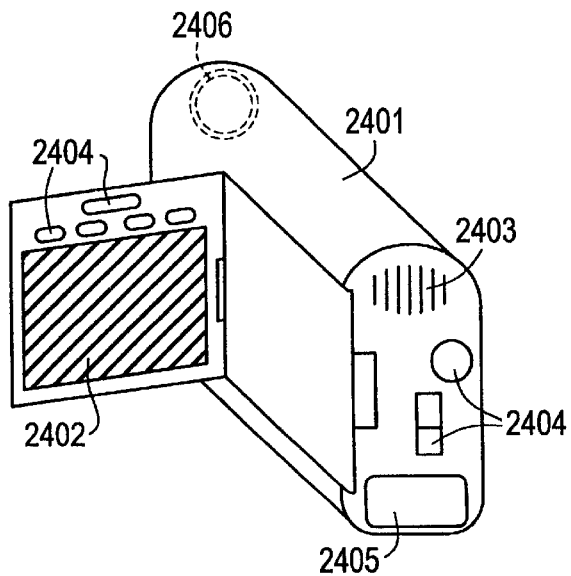

FIG. 3E shows a portable video camera. This device includes a main body 2401 equipped with an image receiving portion 2406, an audio input portion 2403, an operation switch 2404, an active matrix type liquid crystal display 2402, and a battery 2405.

Figure 3F:
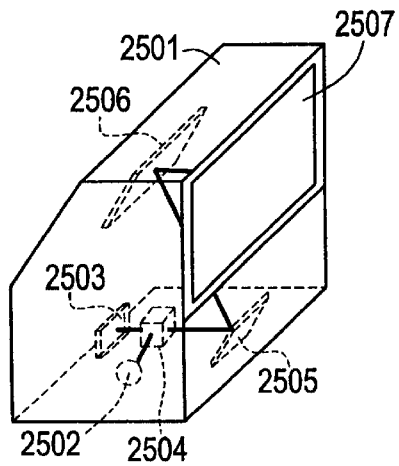

FIG. 3F shows a rear projection type liquid crystal display device. This structure is such that a main body 2501 is equipped with a screen for projection. Displaying is made in such a way that light from a light source 2502 is separated by a polarizing beam splitter 2504, the separated light is optically modulated by a reflection type liquid crystal display device 2503, the optically modulated light is reflected by reflectors 2505 and 2506, and the reflected light is projected onto a screen 2507.

In this example, a reflection type is used for the liquid crystal display device 2503. However, a transmission type liquid crystal display device may be used. In this case, it is sufficient if the optical system is changed.

In these examples, liquid crystal display devices have been mainly shown. However, an EL display device may be adopted as an active matrix type display device.

According to the present invention disclosed in the present specification, it is possible to provide a TFT having high withstand voltage and small OFF-state current.

What is claimed is:

1. A semiconductor device comprising:
    an active layer formed over a substrate, said active layer having source and drain regions, and a channel region therebetween;
    a gate insulating film formed on said active layer; and
    a gate electrode formed on said gate insulating film,
    wherein a thickness of said active layer gradually becomes thinner in a direction from said channel region toward said source and drain regions,
    wherein the thickness of said active layer at side end portions of said channel region is thinner than that at an inner portion of said channel region.

2. A semiconductor device according to claim 1, wherein said gate electrode comprises a material which is able to be anodized and to withstand a thermal oxidation step.

3. A semiconductor device according to claim 1, wherein an upper end portion of said channel region is selectively oxidized.

4. A semiconductor device according to claim 1, wherein said semiconductor device is selected from the group consisting of a portable information terminal, a portable phone, and a portable video camera.

5. A semiconductor device comprising:
    an active layer formed over a substrate, said active layer having source and drain regions, and a channel region therebetween;
    a gate insulating film comprising silicon oxide formed on said active layer; and
    a gate electrode formed on said gate insulating film,
    wherein a thickness of said active layer gradually becomes thinner in a direction from said channel region toward said source and drain regions,
    wherein the thickness of said active layer at side end portions of said channel region is thinner than that at an inner portion of said channel region.

6. A semiconductor device according to claim 5, wherein said gate electrode comprises a material which is able to be anodized and to withstand a thermal oxidation step.

7. A semiconductor device according to claim 5, wherein an upper end portion of said channel region is selectively oxidized.

8. A semiconductor device according to claim 5, wherein said semiconductor device is selected from the group consisting of a portable information terminal, a portable phone, and a portable video camera.

9. A semiconductor device comprising:
   an active layer formed over a substrate, said active layer having source and drain regions, and a channel region therebetween;
   a gate insulating film formed on said active layer;
   a gate electrode formed on said gate insulating film;
   a insulating film comprising silicon nitride formed over said gate insulating film;
   a leveling film comprising organic resin formed on said insulating film;
   a source electrode formed on said leveling film, said source electrode electrically connected to said source region; and
   a drain electrode formed on said leveling film, said drain electrode electrically connected to said drain region,
   wherein a thickness of said active layer gradually becomes thinner in a direction from said channel region toward said source and drain regions,
   wherein the thickness of said active layer at side end portions of said channel region is thinner than that at an inner portion of said channel region.

10. A semiconductor device according to claim 9, wherein said gate electrode comprises a material which is able to be anodized and to withstand a thermal oxidation step.

11. A semiconductor device according to claim 9, wherein an upper end portion of said channel region is selectively oxidized.

12. A semiconductor device according to claim 9, wherein said semiconductor device is selected from the group consisting of a portable information terminal, a portable phone, and a portable video camera.

13. A semiconductor device according to claim 9, wherein said organic resin is selected from the group consisting of acryl, polyimide, polyamide, polyimideamide and epoxy.

14. A projector comprising:
   a display device having at least one thin film transistor, said thin film transistor including:
   an active layer formed over a substrate, said active layer having source and drain regions, and a channel region therebetween;
   a gate insulating film formed on said active layer; and
   a gate electrode formed on said gate insulating film,
   wherein a thickness of said active layer gradually becomes thinner in a direction from said channel region toward said source and drain regions,
   wherein the thickness of said active layer at side end portions of said channel region is thinner than that at an inner portion of said channel region.

15. A projector according to claim 14, wherein said gate electrode comprises a material which is able to be anodized and to withstand a thermal oxidation step.

16. A projector according to claim 14, wherein an upper end portion of said channel region is selectively oxidized.

17. A projector according to claim 14, wherein said display device is selected from the group consisting of a liquid crystal display device and an electroluminescence display device.

18. A projector comprising:
   a display device having at least one thin film transistor, said thin film transistor including:
   an active layer formed over a substrate, said active layer having source and drain regions, and a channel region therebetween;
   a gate insulating film comprising silicon oxide formed on said active layer; and
   a gate electrode formed on said gate insulating film,
   wherein a thickness of said active layer gradually becomes thinner in a direction from said channel region toward said source and drain regions,
   wherein the thickness of said active layer at side end portions of said channel region is thinner than that at an inner portion of said channel region.

19. A projector according to claim 18, wherein said gate electrode comprises a material which is able to be anodized and to withstand a thermal oxidation step.

20. A projector according to claim 18, wherein an upper end portion of said channel region is selectively oxidized.

21. A projector according to claim 18, wherein said display device is selected from the group consisting of a liquid crystal display device and an electroluminescence display device.

22. A projector comprising:
   a display device having at least one thin film transistor, said thin film transistor including:
   an active layer formed over a substrate, said active layer having source and drain regions, and a channel region therebetween;
   a gate insulating film formed over said active layer;
   a gate electrode formed on said gate insulating film;
   a insulating film comprising silicon nitride formed over said gate insulating film;
   a leveling film comprising organic resin formed on said insulating film;
   a source electrode formed on said leveling film, said source electrode electrically connected to said source region; and
   a drain electrode formed on said leveling film, said drain electrode electrically connected to said drain region,
   wherein a thickness of said active layer gradually becomes thinner in a direction from said channel region toward said source and drain regions,
   wherein the thickness of said active layer at side end portions of said channel region is thinner than that at an inner portion of said channel region.

23. A projector according to claim 22, wherein said gate electrode comprises a material which is able to be anodized and to withstand a thermal oxidation step.

24. A projector according to claim 22, wherein an upper end portion of said channel region is selectively oxidized.

25. A projector according to claim 22, wherein said display device is selected from the group consisting of a liquid crystal display device and an electroluminescence display device.

26. A projector according to claim 22, wherein said organic resin is selected from the group consisting of acryl, polyimide, polyamide, polyimideamide and epoxy.

* * * * *